United States Patent [19]
Tokunaga et al.

[11] Patent Number: 6,038,132
[45] Date of Patent: *Mar. 14, 2000

[54] MEMORY MODULE

[75] Inventors: Muneharu Tokunaga; Takakazu Fukumoto, both of Tokyo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/852,294

[22] Filed: May 7, 1997

[30] Foreign Application Priority Data

Dec. 6, 1996 [JP] Japan ................................ 8-327147

[51] Int. Cl.[7] .................................................. H05K 07/02
[52] U.S. Cl. .......................... 361/760; 361/765; 361/736;
361/784; 361/779; 361/803; 395/401; 395/402;
395/405; 395/427; 395/431; 395/474; 395/475;
365/63; 365/51
[58] Field of Search .................................. 361/760, 765,
361/736, 784, 779, 803; 365/63, 51

[56] References Cited

U.S. PATENT DOCUMENTS

| | | | |
|---|---|---|---|
| 5,191,404 | 3/1993 | Wu et al. ................................. | 257/724 |
| 5,375,084 | 12/1994 | Begun et al. ............................ | 365/63 |
| 5,412,538 | 5/1995 | Kikinis et al. .......................... | 361/792 |
| 5,513,135 | 4/1996 | Dell et al. ............................... | 365/52 |
| 5,661,339 | 8/1997 | Clayton .................................. | 257/678 |
| 5,754,408 | 5/1998 | Derouiche .............................. | 361/773 |

FOREIGN PATENT DOCUMENTS

| | | |
|---|---|---|
| 0586069A2 | 3/1994 | European Pat. Off. . |
| 6334294A | 12/1994 | Japan . |
| 6338587A | 12/1994 | Japan . |
| 7022727A | 1/1995 | Japan . |

OTHER PUBLICATIONS

80486 Motherboard User's Guide, 1994.

*Primary Examiner*—Leo P. Picard
*Assistant Examiner*—David Foster

[57] ABSTRACT

A memory module capable of changing the generation of semiconductor memory devices by changing the design of a unit board without changing the design of a mother board.

The mother board has connection terminals having an ability of connecting with first and second generation type unit boards, so that even when a connection terminal location is changed as a result of the generation change of the semiconductor memory devices, the next unit board can be connected to the mother board by selecting an appropriate terminal from connection terminals on the mother board.

14 Claims, 7 Drawing Sheets

MEMORY MODULE

FIELD OF THE INVENTION

The present invention relates to a memory module comprising a unit board provided with a semiconductor memory device and a mother board including the unit board.

BACKGROUND OF THE INVENTION

Conventionally, in order to the number of semiconductor memory devices provided on a mother board, there has been employed many kinds of direct mounting methods on an upper and a lower surface of the mother board. Therefore, the number of semiconductor memory devices to be mounted was limited by a mounting area on the mother board.

To solve such a problem, that is, to increase the memory capacity of the mother board, there has been proposed a method disclosed in Japanese Patent Application No. 8-76947 in which semiconductor memory devices are mounted on an unit board and the unit boards are mounted on the mother board.

On the other hand, the memory capacity of semiconductor memory devices has been quadrupled along with an advancement of generations. However, when the semiconductor memory devices are replaced with new generation semiconductor memory devices (namely, memory devices which have four times larger memory capacity than the previous generation semiconductor memory devices), the number of terminals for connecting the unit board with the mother board and an allocation thereof are changed. Therefore, the number of terminals and the allocation thereof on the mother board are required to be changed each time the generation of the semiconductor memory devices changes in the aforementioned method.

SUMMARY OF THE INVENTION

An object of the present invention is to provide a memory module capable of applying new generation type semiconductor memory devices mounted thereon by changing a design of a unit board without changing a design of a mother board.

It has been found that, if a mother board having connection terminals for connection with at least two generation types of unit boards, one part of the connection terminals applicable for a first generation type unit board and the other part of the connection terminals applicable for a second generation type unit board, the mother board need not to be redesigned and is able to cope with the generation change of the semiconductor memory devices.

According to a first aspect of the present invention, there is provided a memory module comprising:

at least two kinds of unit boards, a first unit board having a plurality of first generation type semiconductor memory devices provided thereon and connection terminals for connection with a mother board, and a second unit board having a plurality of second generation type semiconductor memory devices provided thereon and connection terminals for connection with the mother board; and a mother board having first connection terminals capable of connecting with the connection terminals of said first unit boards and second connection terminals capable of connecting with the connection terminals of the second unit boards, the mother board comprising first regions for mounting the first unit boards and second regions for mounting the second unit boards, each of the first regions for mounting the first unit boards substantially overlapping a corresponding one of the second regions for mounting the second unit board.

When it is necessary to change the generation of the semiconductor memory devices by using the memory module with such a structure, only the design of the unit board is changed. The unit board is connected by selecting and connecting only necessary terminals out of connection terminals provided in advance on the mother board so that the unit board can be provided after the design change of the unit board without changing the design of the mother board. Therefore, according to the present invention, it is possible to change the generation of the semiconductor memory devices without changing the design of the mother board.

In particular, by means of such procedure, it becomes possible to replace the unit board without changing the size of the mother board region on which the unit board is packaged, or while minimizing the size change thereof.

Furthermore, as described above, according to the present invention, the change of the mother board is not required at the time of the replacement of the unit board. Consequently, the size of the mother board is not changed even when the unit board is enlarged along with the generation change of the semiconductor memory devices in order to change the generation of the semiconductor devices without changing the size of the memory module and, to increase the memory capacity as the mother board.

In an embodiment of the present invention, connection terminals are provided on the mother board for connection with three kinds of unit boards. By using three kinds of units board corresponding to the connection terminals, it becomes possible to change the generation of the semiconductor memory devices of three generations.

The term "generation of semiconductor memory devices" generally refers to the generation of the memory capacity of the semiconductor memory devices. Specifically, the generation of the semiconductor memory devices refers to the generation of the memory capacity of the semiconductor memory devices which increases by four times such as 1 M-bit, 4 M-bits, 16 M-bits, and the like. In the present invention, the generation change thereof includes a case in which the memory capacity is the same and the number of access bits increases.

The arrangement of the connection terminals for connection with the mother board provided on the first and second unit boards is designed in agreement with a pin arrangement (allocation order or the like) of the semiconductor memory devices provided on each of the unit boards. Therefore it is also necessary that the arrangement of connection terminals provided on the mother board for connection with two kinds of unit boards to agree with the pin arrangement and the like thereof. Consequently, since the arrangement (allocation order or the like) of the connection terminals for connection with the two different kinds of unit boards are different from each other, it is difficult to provide common terminal and to commonly use the common terminals. Therefore, according to the present invention, the connection terminals for connection with the unit board for connecting the second unit board is arranged in parallel and to the outside of the connection terminal for connection with the unit board for connecting the first unit board. Further, the connection terminals common between respective unit boards are connected with wiring on the mother board.

Accordingly, it is preferred that the connection terminals for connecting the first and the second unit boards to the mother board are designed so that the terminals common between the two unit boards are arranged as close to each other as possible for shortening the wiring on the mother board and for reducing the laminated wiring.

BRIEF DESCRIPTION OF THE DRAWINGS

The present invention will become more fully understood accompanying drawings which are given by way of illustration only, and thus are not limitative of the present invention, and wherein.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE INVENTION

Figure 2:
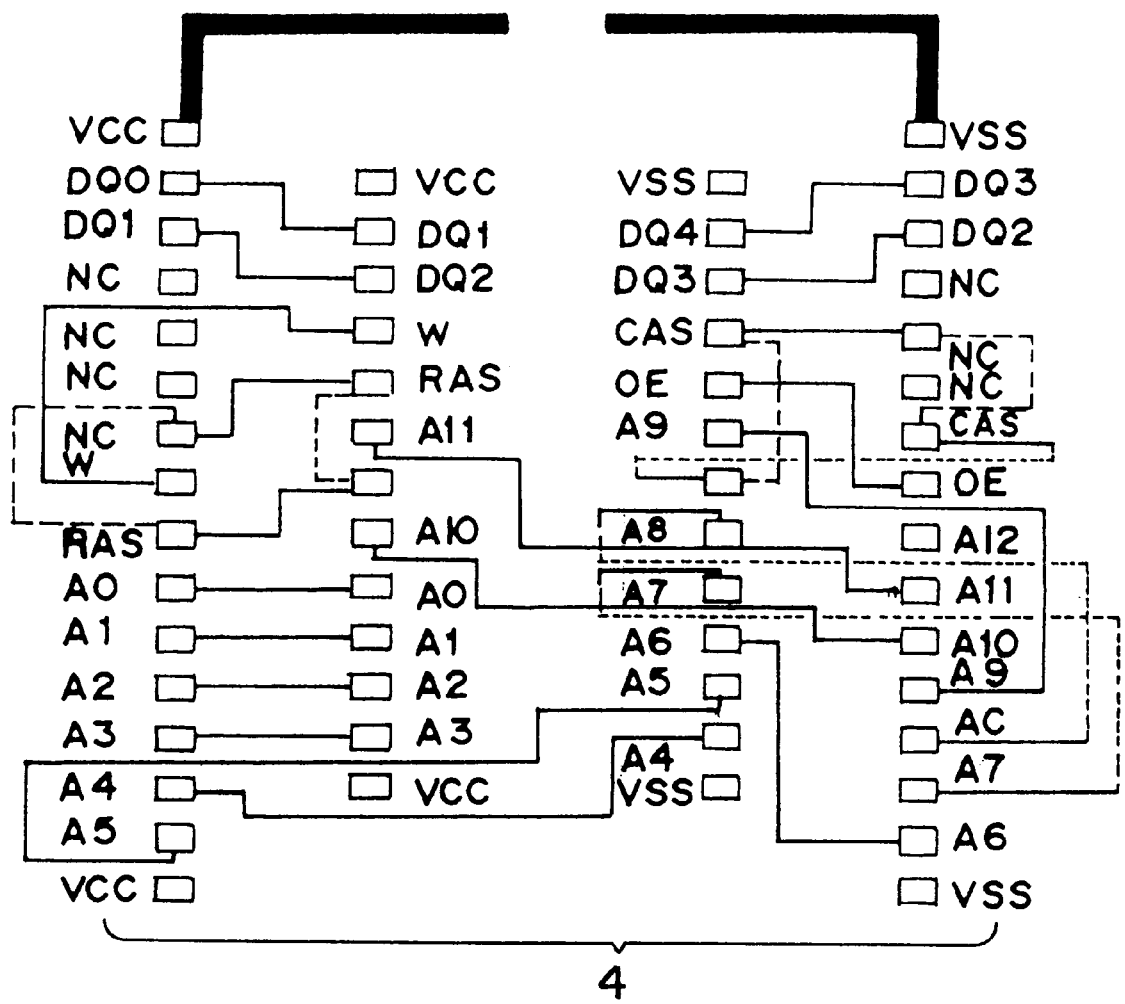
FIG. 2 is a layout view of connection terminals for connection with a unit board commonly used as a unit board for 64 M-bit DRAM's (×4) and a unit board for 16 M-bit DRAM's (×4) according to an embodiment of the invention.
Figure 3:
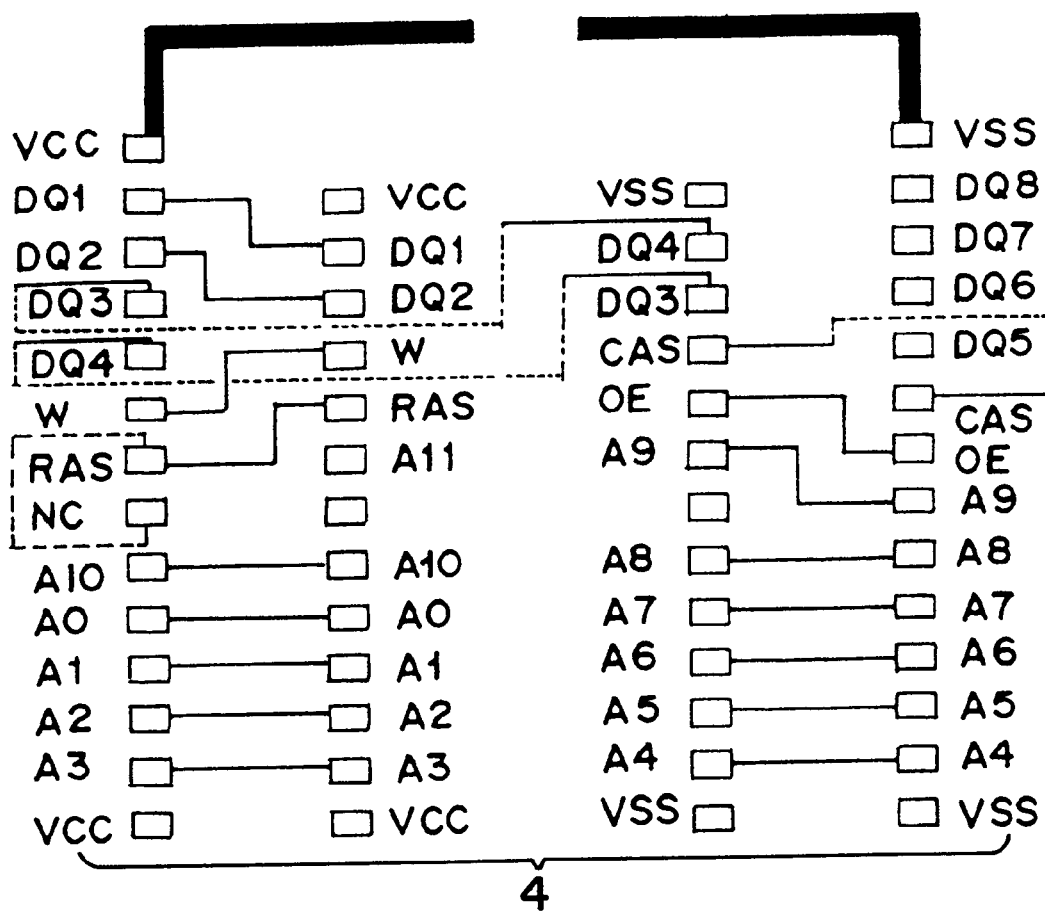
FIG. 3 is a layout view of connection terminals for connection with a unit board commonly used as a unit board for 16 M-bit DRAM's (×8) and a unit board for 16 M bit DRAM's (×4) according to an embodiment of the invention.

In a first preferred embodiment, as shown for example in FIG. 3 each of the first and second connection terminals of the mother board may be arranged in two vertical rows in parallel to each other. The second connection terminals of the mother board are arranged in parallel and outside with respect to the first connection terminals. That is, FIG. 2 shows four vertical rows of connection terminals provided on the mother board. The two outermost rows (the first and fourth rows) are the connection terminals for connection with the first unit board. The two innermost rows (the second and third rows) are the connection terminals for connection with the second unit board. Terminals common between respective unit boards of the first and second connection terminals are connected to each other on the mother board.

As shown in FIG. 2, a first region can be defined as the surface area of the mother board between the connection terminals for connection with the first unit board. That is, the first region is the surface area of the mother board between the first and fourth rows of connection terminals.

Likewise, a second region can be defined as the surface area of the mother board between the connection terminals for connection with the second unit board. That is, the second region is the surface area of the mother board between the second and third rows of connection terminals.

Figure 5:
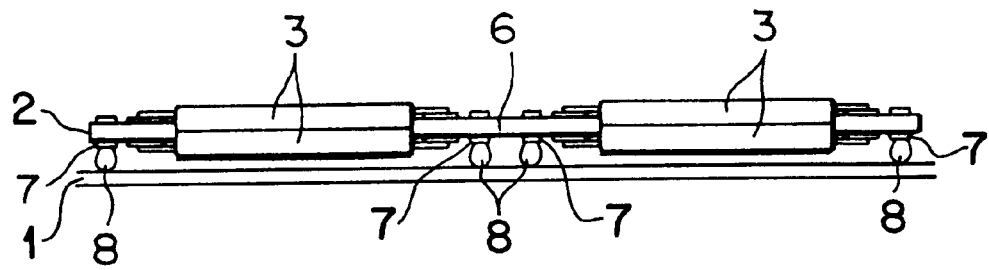
FIG. 5 is a side view of a unit board according to an embodiment of the invention.

In a second preferred embodiment of the present invention as shown for example in FIG. 5, each of the unit boards may be provided with four first generation semiconductor memory devices so as to have a unit board having a memory capacity of the second generation. Since the memory capacity of the semiconductor memory devices are increased by four times, it becomes possible to handle such unit board as a semiconductor memory device having the next generation memory capacity by providing four semiconductor memory devices on the unit board. Furthermore, since the supply amount of the most recent generation of the semiconductor memory devices is generally precarious, four previous generation semiconductor memory devices which are supplied in a stable amount can be used in place of the most recent generation semiconductor memory devices.

In this case, as shown in FIG. 5, it is preferred to realize a high density mounting such that two semiconductor memory devices are provided on an upper surface and a lower surface of the unit board, respectively.

Figure 8:
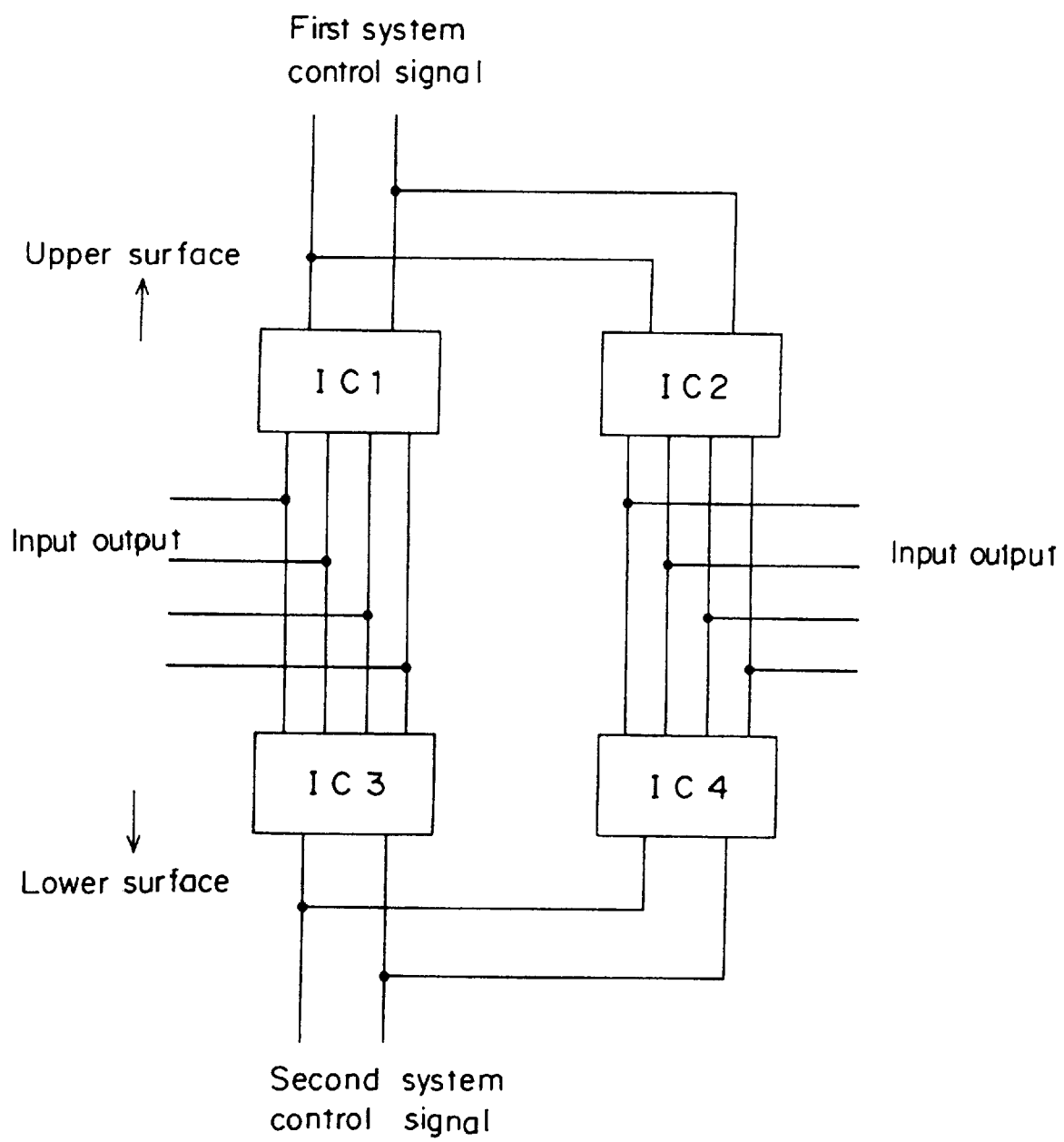
FIG. 8 is an electric wiring view of a two system control according to an embodiment of the present invention.

In a third embodiment of the present invention, as shawn for example in FIG. 8, it is preferred that the semiconductor memory devices on the upper surface of the unit board may be controlled by a first control system and the semiconductor memory devices on the lower surface of the unit board may be controlled by a second control system. Thereby, access to the semiconductor memory devices on the upper surface of the unit board using the first control system and access to the semiconductor memory devices on the lower surface of the unit board using the second control system can be made in an alternate manner. Thus, the time required for access to the semiconductor memory devices is reduced, thereby making it possible to write data in the semiconductor memory devices and to read data therefrom at a high speed. It is possible to modify the unit boards which are controlled with two control systems, to be controlled by one control system by removing either the semiconductor memory devices on the upper surface of the unit board or the semiconductor memory devices on the lower surface of the unit board.

Figure 7:
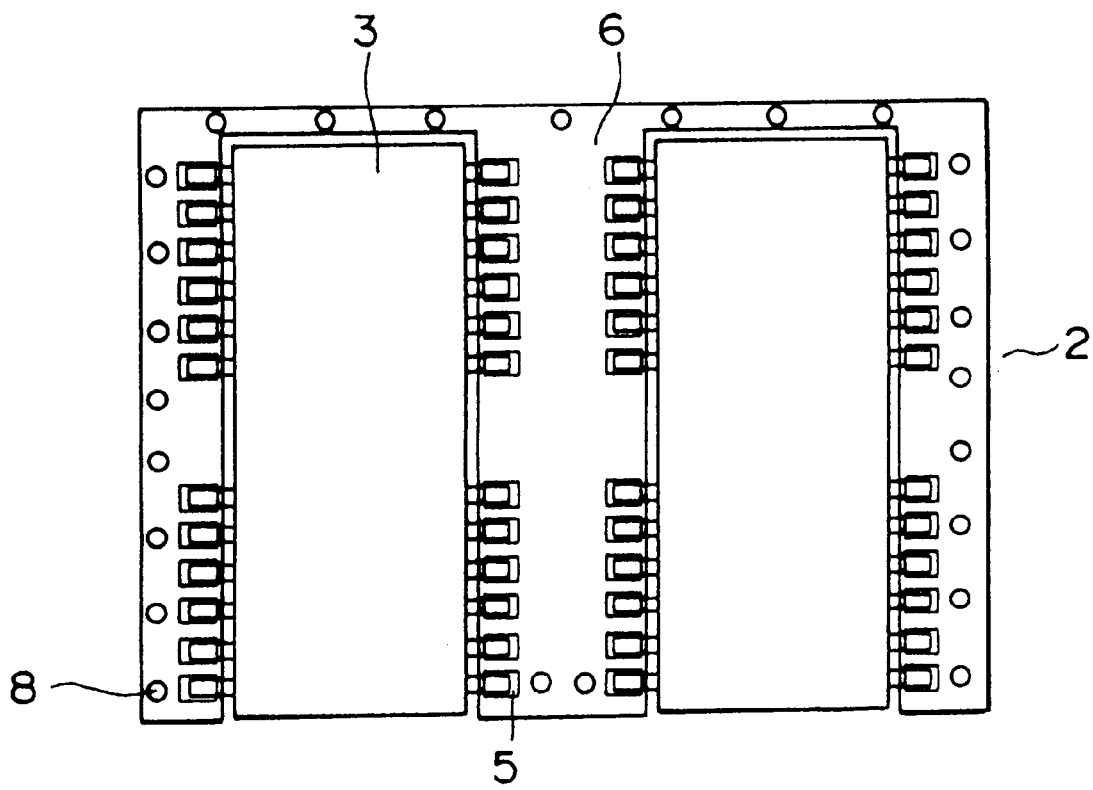
FIG. 7 is a bottom view of a unit board according to an embodiment of the invention.

In the present invention, the connection terminals for connection with the mother board may be a lead type terminal. By using the lead type terminal, the connection terminal can be easily handled as compared with the case of the bump connection. Further, the connection terminals for connection with the mother board are preferably a four direction type provided along four sides around the unit board as shown in FIG. 7. By adopting the connection terminals for connection with a four direction type mother board, the connection terminals provided on the mother board for connection with the unit board can be arranged in a rectangular configuration. As a result, a space with the connection terminal for connection with the unit board can be widened and the routing of the circuit wiring on the mother board can be facilitated. Therefore, the laminated wiring (wiring on an internal layer) is reduced, and an attempt can be made to reduce the capacity of the circuit wiring.

The memory module according to the present invention is preferably used for an ECC function and/or parity function. The aforementioned semiconductor memory devices can be also used for an ECC function and/or a parity function, because a part of the semiconductor memory devices in the memory module is used for the ECC function and/or the parity function. Therefore, the memory module may have a checking function of the semiconductor memory devices.

As is apparent from the aforementioned explanation, when it is required to change the generation of the semiconductor devices in order to increase the memory capacity, the generation of the semiconductor memory devices can be changed without changing the design of the mother board. Therefore, it is possible to shorten the development period of the memory module corresponding to the next generation memory capacity and to reduce the development cost thereof.

Furthermore, it is possible to treat a unit board as one semiconductor memory device having a second generation memory capacity by providing four first generation semiconductor memory devices on the unit board.

In particular, it is possible to supply memory modules in a stable manner irrespective of the supply amount of the semiconductor memory devices by using such a unit board with four first generation semiconductor memory devices in place of second generation semiconductor memory devices whose supply amount is unstable.

PREFERRED EMBODIMENT OF THE INVENTION

Figure 1:
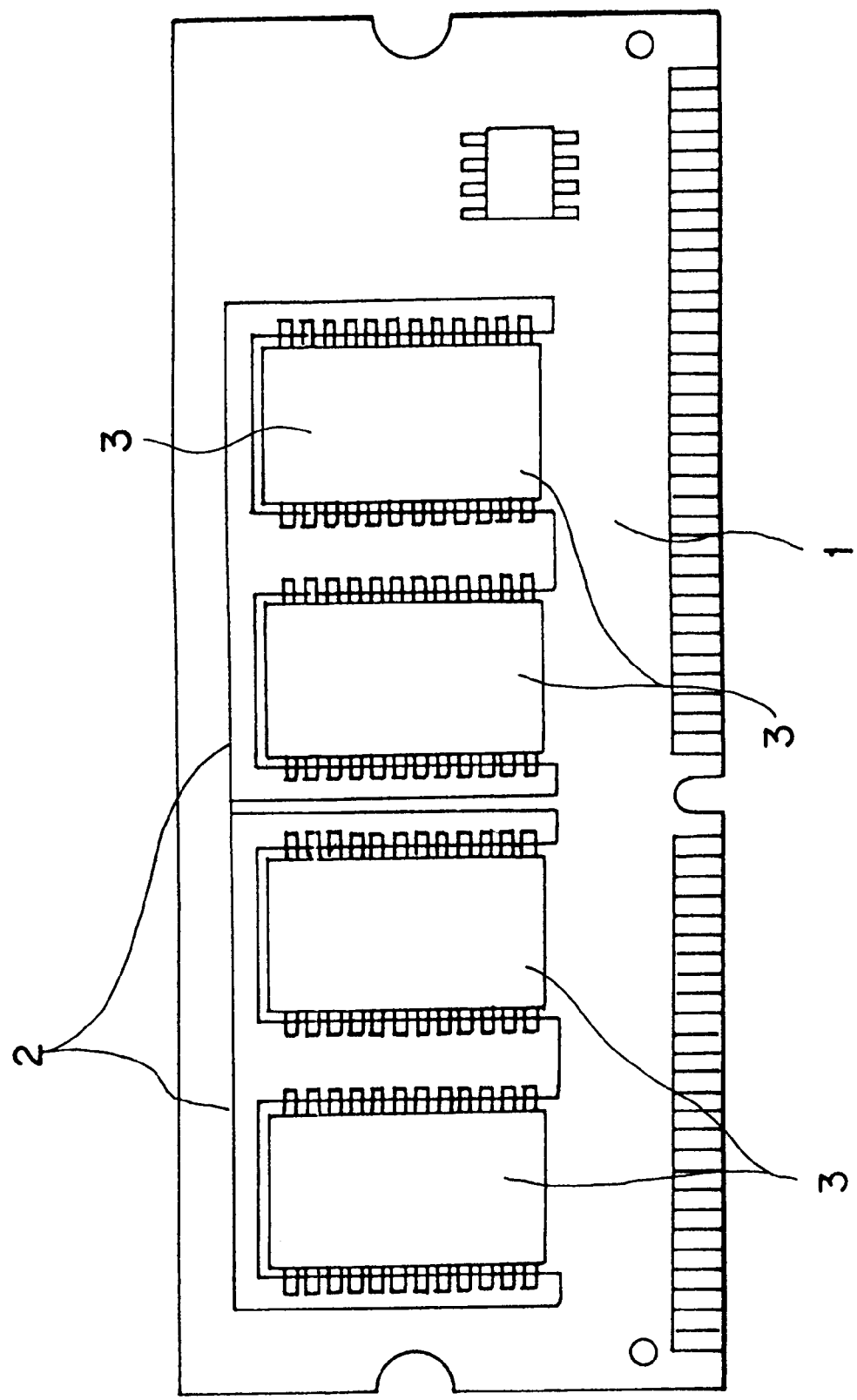
FIG. 1 is an external view showing a memory module wherein a unit board is provided on a mother board according to an embodiment of the present invention.

FIG. 1 is an external view showing a memory module according to the embodiment of the present invention.

The memory module comprises a mother board 1 and a unit board 2. The mother board 1 has connection terminals for connection with the unit board. The unit board 2 can be provided on the mother board 1 by arranging and connecting connection terminals for connection with the mother on the connection terminals for connection with the unit board. The unit board 2 is provided with two semiconductor memory devices 3 on the upper surface of the unit board and two semiconductor memory devices (not shown) on the lower surface thereof. Thus, a total of four semiconductor memory devices are provided on each unit board, and each of the four semiconductor memory devices are connected to each other with the connection terminals for connection with the mother board 1 and the circuit wiring.

Furthermore, two kinds of unit boards may be prepared so that semiconductor memory devices of different generations can be provided on the mother board. In such a case connection terminals 4 are provided on the mother board 1 for connection with the two different kinds of unit boards. With such a structure, a first kind of unit board 2 can be replaced by a second kind of unit board by removing the first unit board and connecting the second unit board to the connection terminals 4 on the mother board corresponding to the kind of second unit board. Thus, an attempt can be made to change the generation of the semiconductor memory devices provided on the mother board 1 and to increase the memory capacity of the memory module.

In the present embodiment, there is described a case in which two kinds of unit boards are used. It is also possible to use three or more kinds of unit boards.

FIG. 2 shows a layout of connection terminals 4 on the motherboard for connection with the unit board. These terminals 4 shown in FIG. 2, can be connected to two different kinds of unit boards. That is, a unit board for 16 megabyte DRAM's (JEDEC standard 4 M-bits×4 DRAM's) can be connected to the mother board by the first and fourth rows of connection terminals 4. A unit board for 64 megabyte DRAM's (JEDEC standard 16 M-bits×4 DRAM's) can be connected to the mother board by the second and third rows of connection terminals 4.

Two vertical rows of 16 connection terminals are provided on the outside for connection with the unit boards for the 64 M-bit DRAM's. Two rows of 13 connection terminals are provided on the inside for connection with the unit board for the 16 M-bit DRAM's. Connection terminals commonly used by the two kinds of unit boards are designed so that the connection terminals are arranged as close to each other as possible and are connected to each other with the wiring on the mother board as shown in FIG. 2.

The aforementioned mother board 1 has a laminated structure and the wiring on the mother board is arranged on an external layer and on an internal layer, respectively (FIGS. 2 and 3).

First, a procedure for reading data will be explained in the case where the unit board 2 for 16 M-bit unit DRAM's is provided on the mother board 1 according to the embodiment. The aforementioned unit board 2 is connected to the mother board 1 with the terminals (inside) for the 16 M-bit DRAM's, and an address signal is divided into upper place bits and lower place bits by RAS/CAS to be input from address terminals A0 through A11.

In the embodiment, the semiconductor memory devices 3 provided on the unit board 2 are divided into a first control system comprising two semiconductor memory devices on the upper surface of the unit board 2 and a second control system comprising two semiconductor devices provided on the lower surface thereof as shown in FIG. 8.

Accordingly, when data in the semiconductor devices on the unit board 2 is read, the address signal is inputted to the first control system selected by the RAS/CAS so that the data in the two semiconductor memory devices on the upper surface is read. Since the semiconductor devices used in the embodiment get access to 4-bit data, the 4-bit data in the aforementioned address of the first semiconductor memory device (ICI) selected by the RAS/CAS is outputted as 4-bit signals DQ1 through DQ4 in the same manner. Next, 4-bit data of the other semiconductor memory devices (IC2) is outputted as 4-bit data signals DQ1 through DQ4 in the same manner.

Subsequently, the second control system is selected and the two semiconductor memory devices (IC3, IC4) on the lower surface of the unit board are accessed one after another so that the 4-bit data is outputted from each of the semiconductor memory devices in the same manner.

These data items pass through circuit wiring (not shown) on the mother board 1 to be outputted to an input/output pin (not shown) of the mother board provided in accordance with the specifications of the JEDEC standard.

Incidentally, terminals such as VCC, VSS, A0 through A11, RAS, CAS and the like are connected to the input/output pins (not shown) of the mother board with a path wiring on the mother board 1, respectively.

On the other hand, when the unit board 2 for the 64 Mbit DRAM'S is provided, the mother board 1 and the unit board 2 are connected to each other with the connection terminals for the 64 M-bit DRAM's (outside). Thus, address signals are divided into upper place bits and lower place bits by the RAS/CAS to be inputted from the address terminals A0 through A12 to the unit board 2. In the case of the 64 M-bit DRAM's, A12 terminal is separately provided because the address number increases.

Furthermore, in the case of the unit board for the 64 M-bit DRAM's, the data signal can be read by the method similar to the case of unit board for the aforementioned 16 M-bit DRAM'S. In the embodiment, the aforementioned data input/output terminals (DQ0 through DQ3) can be used for data writing by the switching with the RAS/CAS.

On the aforementioned mother board 1, two or more connection terminals are provided for connection with the unit board which can correspond to such 16/64 M-bit DRAM's. A memory module which can correspond to a plurality of generations can be formed by providing the unit boards 2 shown in FIG. 4 on the mother board 1, respectively. FIG. 1 shows a case in which the connection terminals are provided at two places on the mother board 1 for connection with the aforementioned unit boards, and the unit boards 2 are provided on the two places, respectively.

Incidentally, the specifications of the aforementioned mother board follow the JEDEC standard. In the JEDEC standard, 168 pins and 8 bytes DIMM specification is determined for the mother board.

In this manner, the generation of the whole memory module can be changed. That is, the memory capacity can be increased with the replacement of the unit board without changing the design of the mother board 1 by providing in advance on the mother board 1 connection terminals for connection with the unit board corresponding respectively to the unit board for the 16 M-bit DRAM's and the unit board for the 64 M-bit DRAM's.

Thus, when a mother board corresponding to a plurality of generations is developed in advance, the generation of the memory capacity of the memory module can be changed with the design change of the unit board. Thus the development period of the next generation memory module can be shortened and the development cost can be reduced.

With respect to the connection terminal for connection with the aforementioned unit board, when the former unit board is replaced with the latter unit board by arranging the connection terminal corresponding to the unit board for the 64 M-bit DRAM's outside of the connection terminal corresponding to the unit board for the 16 M-bit DRAM's, as shown in FIG. 2, a region occupied by the former unit board is equal to or is included in the region occupied by the latter unit board.

As a consequence, the generation of the unit board is changed from the 16 M-bit DRAM to 64 M-bit DRAM without changing the package region of the unit board 2 on the mother board 1, or while minimizing the change of the package region thereof.

The connection terminals 4 for connection with the unit board can be connected to the unit board 2 by solder connection (FIG. 5) using a bump 8 formed on the connection terminal 7 on the unit board, or by solder connection (FIG. 6) of the connection terminal 9 for connection with the lead-shape mother board.

FIG. 3 shows a layout of connection terminals 4 for connection with the unit board in the case where two kinds of unit boards 2 which can be replaced are a unit board for 8-bit access 16 M-bit DRAM's (JEDEC standard 2 M-bit×8 DRAM's) and a unit board for 4-bit access 16 M-bit DRAM's (JEDEC standard 4 M-bit×4 DRAM's).

Furthermore, in this case, the 8-bit access DRAM terminal is arranged in parallel so that the terminals stand in parallel to each other outside of the terminals for the 4-bit access DRAM's in the same manner as the aforementioned case as shown in FIG. 3.

In such an embodiment, four data input/output terminals (DQ1 through DQ4) are provided for connection to the unit board for the 4-bit access 16 M-bit DRAM's. In correspondence to the fact that the access bit number is different, eight data input/output terminals (DQA1 through DQ8) are provided for connection to the unit board for the 8-bit access 16 M-bit DRAM's. Thus, the connection terminals are connected to the input/output pins of the mother board (not shown), respectively.

Incidentally, in the present embodiment, All terminal is not used (not connected) out of the connection terminals for connection with the unit board for the 16 M-bit DRAM's (×4).

In this manner, semiconductor memory devices having the same memory capacity and different access bit numbers can be changed by replacing the two kinds of DRAM unit boards 2 having different access bit numbers without changing the design of the mother board 1. Therefore, the development period of the memory module can be shortened and the development cost can be reduced.

Incidentally, in the present invention, two kinds of mother board connection terminals can be arranged in four vertical rows in parallel to each other so that the terminals provided inside (second row, third row) correspond to one unit board and the terminals provided outside (first row, fourth row) correspond to the other unit board. The aforementioned terminals also can be formed so that the terminals provided on the first and third rows correspond to one unit board, while the terminals provided on the second and fourth rows correspond to the other unit board.

Figure 4:
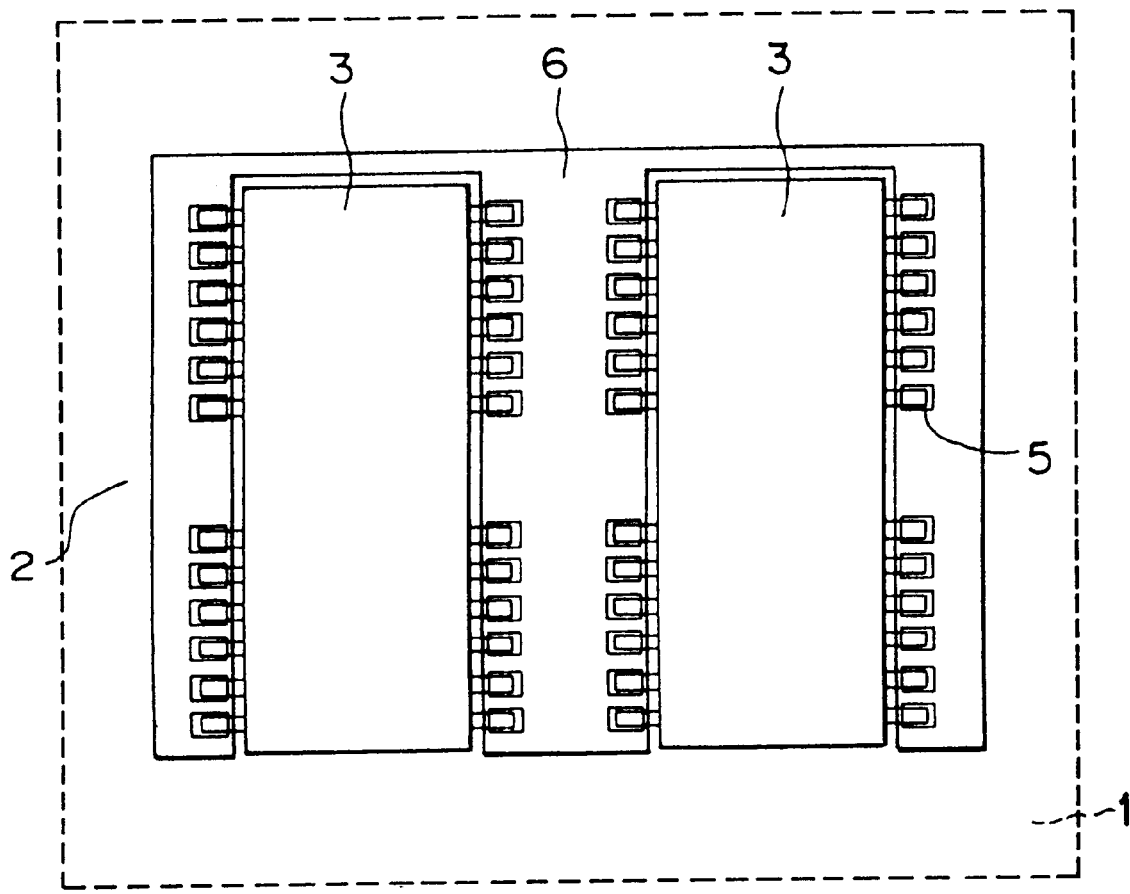
FIG. 4 is a top view of a unit board according to an embodiment of the invention.

FIGS. 4 and 5 respectively show a top view and a side view of a unit board according to the embodiment wherein four semiconductor memory devices 3 are provided.

With respect to the unit board 2, shown in FIG. 4 a land 5 for providing the semiconductor memory devices 3 on a substrate is provided with an open part on a periphery of the land 5. In addition, as shown in FIG. 5, the connection terminal 7 for connection with the mother board is provided on the right and left surrounding part of the substrate 2 at a position corresponding to the connection terminal 4 on the mother board for connection with the unit board to be connected to the land 5 (not shown). Furthermore, on the connection terminal 7 on the mother board, the solder bump 8 for connection with the mother board 1 is provided as shown in FIG. 5.

In this manner, a unit board having the next generation memory capacity can be formed using semiconductor memory devices having the memory capacity of the previous generation by forming the unit board 2 with four semiconductor memory devices 3 of the previous generation one set. In other words, since the memory capacity of the semiconductor memory devices increase by four times at each time of the generation change, such unit board 2 is regarded as one set and can be treated as a semiconductor memory devices having the memory capacity of the next generation.

Furthermore, since the supply amount of the semiconductor memory devices having the most recent generation memory capacity is precarious, it becomes possible to use the semiconductor memory devices having the previous generation memory capacity with a stable supply amount in place of semiconductor memory devices of the most recent generation.

Figure 6:
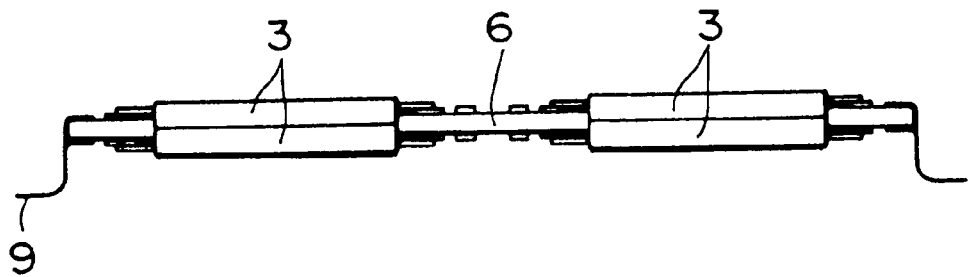
FIG. 6 is a side view of the unit board according to an embodiment of the invention.

On the unit board 2 shown in FIG. 5, a solder bump 8 is provided on the connection terminal 7 for connection with the mother board. However, as shown in FIG. 6, a lead terminal 9 can be used in place of the solder bump 8.

FIG. 7 shows an embodiment (bottom view) of a unit board wherein the connection terminal for connection with the mother board is provided in four directions around the unit board 2. In the embodiment shown in FIG. 4, the connection terminals for connection with the mother board are provided only on a right and a left periphery of the unit board 2. On the other hand, in the embodiment shown in FIG. 7, the connection terminals are also provided on an upper and a lower periphery thereof.

As a consequence, the connection terminals 4 for connection with the unit board can be arranged in a rectangular configuration rather than in two rows of a linear configuration as shown in FIGS. 2 and 3. As a result, a space between the connection terminals 4 for connection with the unit board can be widened and the routing of the circuit wiring on the mother board can be facilitated. At the same time, the laminated wiring structure can be reduced, and an attempt can be made to reduce the capacity of the circuit wiring and the like.

Furthermore, it is possible to use the semiconductor memory devices 3 provided on the unit board 2 as a ECC (Error Correction Code) function and/or a parity function when needed. As a consequence, it becomes possible to check errors in input/output data of the semiconductor memory devices.

Figure 9:
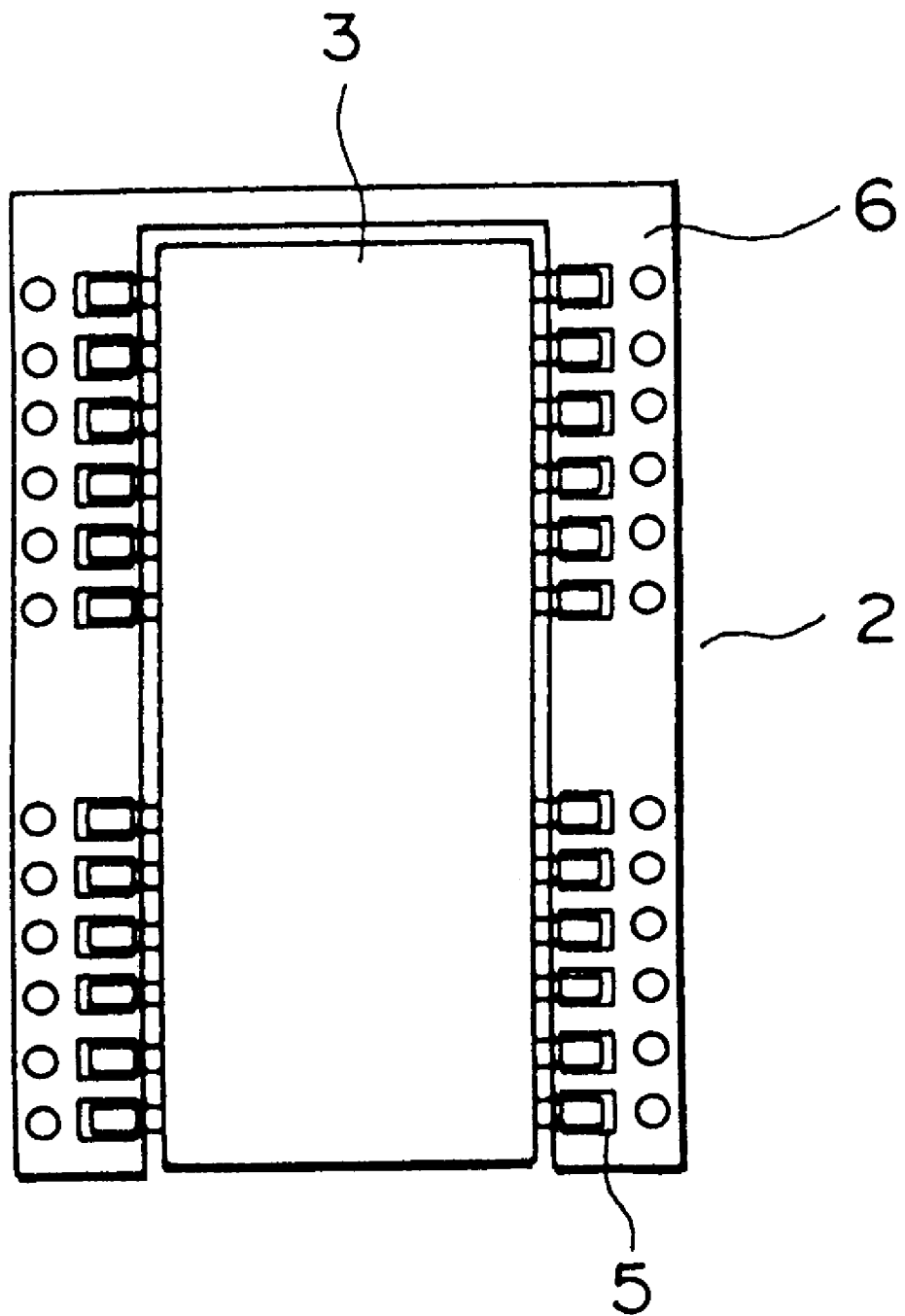
FIG. 9 is a top view of a unit board according to an embodiment of the invention.

In particular, when a plurality of unit boards 2 are provided on the mother board 1, it is possible to use the unit board (corresponding to the unit board divided into the right and left in FIG. 4) having two semiconductor memory devices 3 as shown in FIG. 9 provided on the upper and lower surfaces thereof to raise the package density. By using such a unit board, it becomes possible in some cases to package semiconductor memory devices in a narrow region where semiconductor memory devices cannot be packaged in a unit board 2 having four semiconductor memory devices 3 provided thereon.

Many other variations and adaptations of the above embodiments are possible without departing from the scope of invention as defined in the appended claims.

What is claimed is:

1. A memory module comprising:
    a mother board for mounting at least two kinds of unit boards thereon, said at least two kinds of unit boards including, a first unit board having a plurality of first generation semiconductor memory devices provided thereon and connection terminals for connection with said mother board, and a second unit board having a plurality of second generation semiconductor memory devices provided thereon and connection terminals for connection with said mother board, said mother board including,
        a first array of mother board connection terminals for connecting with connection terminals of one first unit board, said first array of mother board connection terminals defined by two vertical rows of first mother board connection terminals, and
        a second array of mother board connection terminals for connecting with connection terminals of one second unit board, said second array of mother board connection terminals defined by two vertical rows of second mother board connection terminals, said first and second arrays of mother board connection terminals arranged on a surface of said mother board such that at least one vertical row of first mother board connection terminals is between two vertical rows of second mother board connection terminals; and
    at least one first or second unit board mounted to said mother board.

2. The memory module according to claim 1, wherein said first and second arrays of mother board connection terminals are arranged such that said two vertical rows of second mother board connection terminals are in parallel and outside with respect to said two vertical rows of first mother board connection terminals, and terminals of said first and second mother board connection terminals that are common between respective unit boards are connected to each other on said mother board.

3. The memory module according to claims 1, wherein each of said unit boards is provided with four first generation semiconductor memory devices so as to have a unit board having a memory capacity of the second generation.

4. The memory module according to claim 3, wherein two semiconductor memory devices are provided on an upper surface and a lower surface of said unit board, respectively.

5. The memory module according to claim 4, wherein said semiconductor memory devices on the upper surface of said unit board are controlled by a first control system and said semiconductor memory devices on the lower surface of said unit board are controlled by a second control system.

6. The memory module according to claim 1, wherein said connection terminals for connection with said mother board are a lead type terminal.

7. The memory module according to claim 1, wherein said connection terminals for connection with said mother board are provided along four sides around at least one of the unit boards.

8. The memory module according to claim 1, wherein the semiconductor memory devices are used for at least one of an ECC function and a parity function.

9. A memory module comprising:
    a mother board including,
        a first array of mother board connection terminals defined by two vertical rows of first mother board connection terminals capable of connecting to corresponding first semiconductor connection terminals of a first semiconductor device;
        a second array of mother board connection terminals defined by two vertical rows of second mother board connection terminals capable of connecting to corresponding second semiconductor connection terminals of a second semiconductor device, said second semiconductor device having a memory capacity greater than a memory capacity of said first semiconductor device, said first and second arrays of mother board connection terminals arranged on a surface of said mother board such that at least one vertical row of first mother board connection terminals is between two vertical rows of second mother board connection terminals; and
    at least one first or second semiconductor device mounted to said mother board.

10. The memory module according to claim 9, further comprising at least one unit board for mounting said at least one first or second semiconductor device, said unit board including,
    a plurality of unit board connection terminals provided on an upper surface of said at least one unit board and connected to at least one of said first and second semiconductor devices; and
    a plurality of unit board connection terminals corresponding to at least one of said first array of mother board connection terminals and said second array of mother board connection terminals, provided on a lower surface of said at least one unit board and connected to said mother board.

11. The memory module according to claim 10, wherein said plurality of upper unit board connection terminals provided on the upper surface of said at least one unit board is connected to at least two of said first semiconductor devices, and said plurality of lower unit board connection terminals provided on the lower surface of said at least one unit board is connected to said second array of mother board connection terminals.

12. The memory module according to claim 9, wherein the first and second arrays of mother board connection terminals are arranged such that said two vertical rows of said first array are between said two vertical rows of said second array.

13. The memory module according to claim 9, wherein the number of second semiconductor connection terminals on said second semiconductor device is different than the number of first semiconductor connection terminals on said first semiconductor device.

14. A memory module comprising:

a mother board for mounting at least two kinds of unit boards thereon, said at least two kinds of unit boards including, a first unit board having a plurality of first generation semiconductor memory devices provided thereon and connection terminals for connection with said mother board, and a second unit board having a plurality of second generation semiconductor memory devices provided thereon and connection terminals for connection with said mother board, said mother board including, a first array of mother board connection terminals for connecting with connection terminals of one first unit boards, said first array of mother board connection terminals being defined by first mother board connection terminals arranged in a rectangular configuration which includes a pair of spaced first rows and a pair of spaced second rows being directed substantially perpendicular to said first rows, and a second array of mother board connection terminals for connecting with connection terminals of one second unit boards, said second array of mother board connection terminals being defined by second mother board connection terminals arranged in a rectangular configuration which includes a pair of spaced first rows and a pair of spaced second rows being directed substantially perpendicular to said first rows, said first and second arrays of mother board connection terminals arranged on a surface of said mother board such that at least one of said first row of first mother board connection terminals is between two of said first rows of second mother board connection terminal; and at least one first or second unit board mounted to said mother board.

* * * * *